(12) United States Patent
Schlösser et al.

(10) Patent No.: US 6,274,453 B1
(45) Date of Patent: Aug. 14, 2001

(54) MEMORY CELL CONFIGURATION AND PRODUCTION PROCESS THEREFOR

(75) Inventors: Till Schlösser; Franz Hofmann, both of München; Wolfgang Krautschneider, Hamburg, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/405,916

(22) Filed: Sep. 24, 1999

(30) Foreign Application Priority Data

Sep. 24, 1998 (DE) .............................. 198 43 979

(51) Int. Cl.⁷ .................................................. H01L 21/20
(52) U.S. Cl. ........................ 438/386; 438/243; 438/249; 438/392; 257/301; 257/303; 257/306; 257/310
(58) Field of Search ..................................... 257/301, 303, 257/306, 310; 438/243, 249, 386, 392

(56) References Cited

U.S. PATENT DOCUMENTS

| | | | |
|---|---|---|---|
| 5,453,637 | * 9/1995 | Fong-Chun et al. | 257/390 |
| 5,714,779 | * 2/1998 | Auer et al. | 257/306 |
| 5,736,761 | 4/1998 | Risch et al. | 257/301 |
| 5,802,000 | * 9/1998 | Hanmada | 365/205 |
| 5,920,099 | * 7/1999 | Krautschneider et al. | 257/390 |
| 5,920,778 | * 7/1999 | Rosner et al. | 438/270 |
| 5,936,274 | * 8/1999 | Forbes et al. | 257/315 |
| 6,027,861 | * 2/2000 | Yu et al. | 430/316 |
| 6,072,209 | * 6/2000 | Noble et al. | 257/296 |
| 6,104,061 | * 8/2000 | Forbes et al. | 257/330 |

FOREIGN PATENT DOCUMENTS

19640238 A1 * 4/1998 (DE) .

OTHER PUBLICATIONS

Japanese Patent Abstract No. 08017942 (Takehiko), dated Jan. 19, 1996.

* cited by examiner

*Primary Examiner*—Charles Bowers
*Assistant Examiner*—Asok Kumar Sarkar
(74) *Attorney, Agent, or Firm*—Herbert L. Lerner; Laurence A. Greenberg; Werner H. Stemer

(57) ABSTRACT

A memory cell configuration with many ferroelectric or dynamic memory cells provided in a semiconductor substrate. Alternating trenches and lands extend parallel in a longitudinal direction of a main face of the semiconductor substrate. A channel stop layer is buried in the lands and divides the semiconductor substrate into a lower region that includes the trench bottoms and an upper region that includes the land ridges. First planar selection transistors with intervening trench channel stop regions are disposed along the trench bottoms. Second planar selection transistors with intervening land channel stop regions are disposed along the land ridges. The first and second selection transistors have respective source, gate, channel and drain regions, which are offset longitudinally from one another such that source and drain regions of the first and second selection transistors alternate in the transverse direction in the main face of the semiconductor substrate. Isolated word lines are provided which extend in the transverse direction along the main face for triggering the first and second selection transistors in the respective gate regions. Isolated bit lines are provided which extend in an oblique direction along the main face for connecting the first and second selection transistors in the respective source regions. And preferably ferroelectric capacitors are each connected to the drain regions of applicable selection transistors via capacitor contacts.

6 Claims, 4 Drawing Sheets

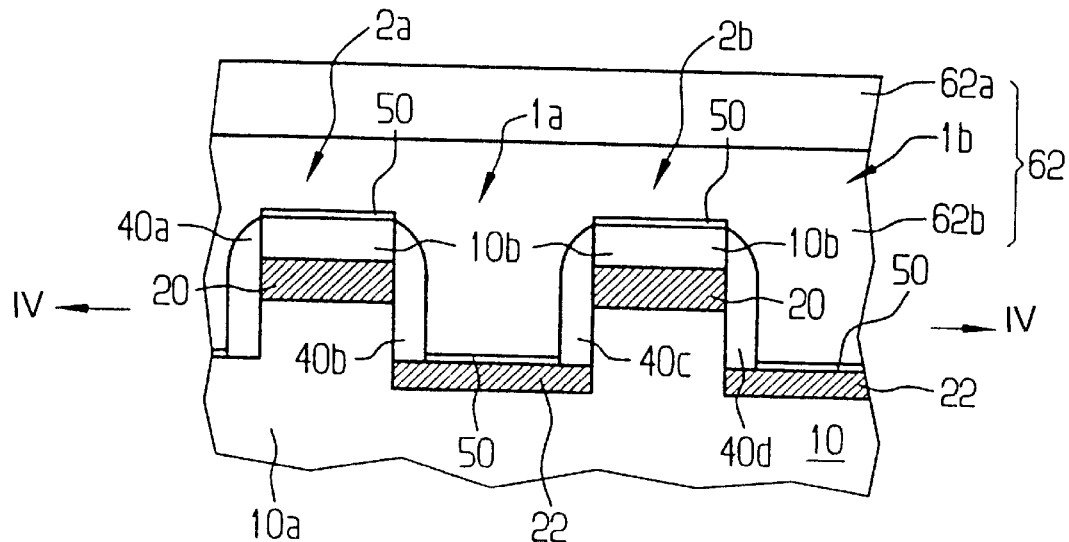
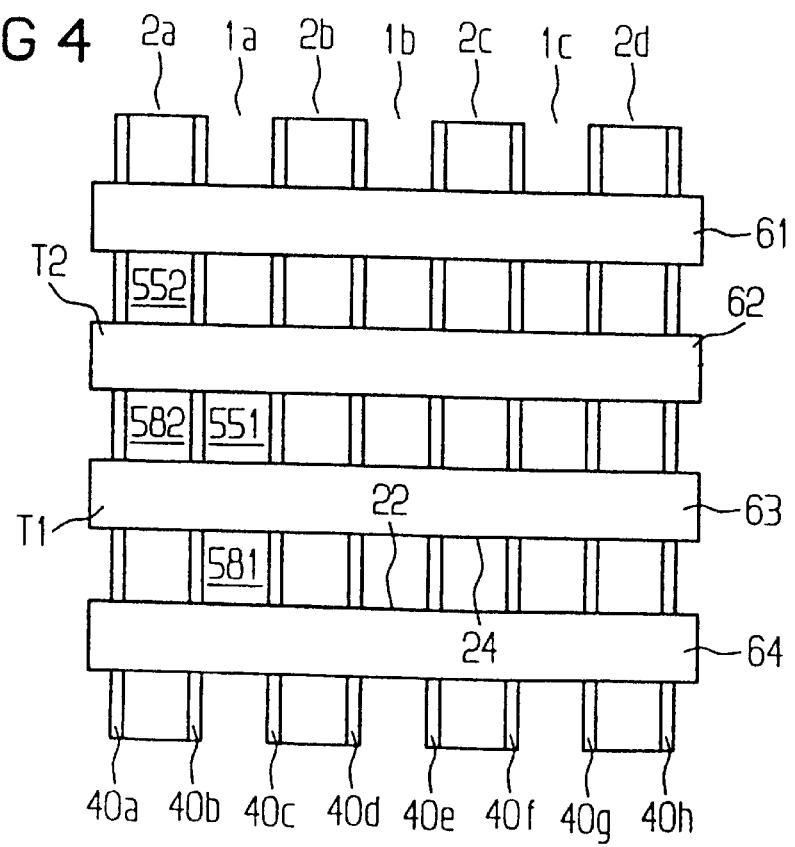

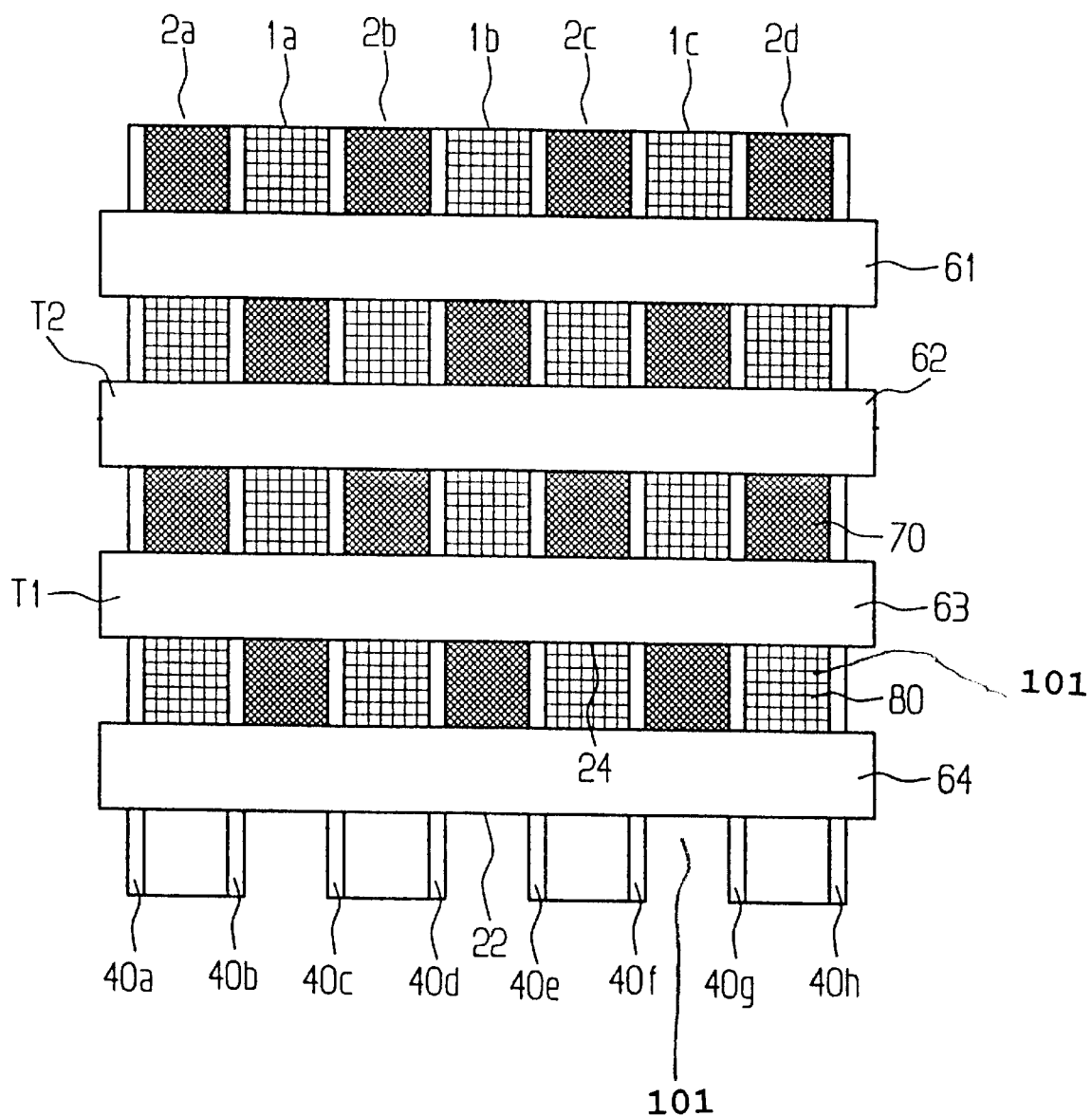

MEMORY CELL CONFIGURATION AND PRODUCTION PROCESS THEREFOR

BACKGROUND OF THE INVENTION

FIELD OF THE INVENTION

The present invention relates to a memory cell configuration with many ferroelectric memory cells (ferroelectric memories or FeRAMs) or a nonvolatile random access memory (NVPRAM or DRAM) with dielectric memory cells and a corresponding production process. The term "semiconductor substrate" is to be understood in the general sense here, and hence refers to a wafer substrate, an epitaxial substrate, a well substrate, and so forth.

Although it can be applied to memories containing any arbitrary foundation material, the present invention and the fundamental problems involved will be explained here in terms of a silicon-based substrate.

In general, a DRAM contains a memory cell configuration whose individual memory cells have a selection transistor and a capacitor connected to it. A read-only memory (ROM) has only a single transistor as its memory cell.

The memory cell configurations are based initially on predominantly planar concepts. In view of the ever-increasing packing density, it has already been proposed for mask-ROM applications that the cell surface of the memory be convoluted by making parallel longitudinal trenches, thus reducing the projection of the cell surface onto the wafer surface by up to 50%. In DRAMs, it is known in particular to utilize the vertical direction for forming capacitors in the form of trench or stacked capacitors.

The general goal in memory technology is to produce single-transistor cells that are markedly smaller than $8F^2$, where F is the minimum feature size of the applicable technology.

Until now, most memory concepts with an area of less than $6F^2$ include vertical transistors.

From Published, Non-Prosecuted German Patent Application DE 195 14 834 A, a read-only memory cell configuration is known that has memory cells with a vertical MOS transistor. The memory cells are disposed along opposite flanks of striplike, parallel isolation trenches. If a width and spacing of the isolation trenches are chosen to be large, then the minimum space required per memory cell is theoretically $2F^2$, where F is the minimum feature size of the technology.

Published, Non-Prosecuted German Patent Application DE 195 10 042 A discloses a read-only memory cell configuration in which the memory cells are disposed in a parallel row, and longitudinal trenches are provided that extend parallel to the rows. The rows are each disposed in alternation on the main face between adjacent longitudinal trenches and on the bottom of the longitudinal trenches. Vertical isolation features are provided for the mutual isolation of the memory cells, which each include one MOS transistor. Word lines extend crosswise to the rows, and they are each connected to the gate electrodes of MOS transistors disposed along different rows.

The minimum space per memory cell here is theoretically $2F^2$, where F is the minimum feature size of the technology. This makes it possible to utilize virtually the entire silicon surface area as an active face. Thus very small cell surfaces can be achieved without having to have recourse to vertical transistors. The result is that process costs are lowered, and reliability is increased. Especially in ferroelectric memory cells, in which the leakage current requirements are not quite as stringent as in the DRAM, such planar concepts have great potential.

From Published, Non-Prosecuted German Patent Application DE 195 43 539 A, a RAM memory cell configuration with a vertical storage capacitor with a ferroelectric or paraelectric storage dielectric is known. For producing the storage capacitor, a dielectric layer for the storage dielectric is created over a large surface area. The dielectric layer is then structured, forming first and second electrodes for the storage capacitors.

According to Published, Non-Prosecuted German Patent Application DE 195 43 539 A, a ferroelectric material for nonvolatile memories is used as the storage dielectric, because this material has spontaneous polarization that exists even in the absence of an external electrical field. Paraelectric material, conversely, is used in DRAM applications, in which a refresh cycle is provided.

In practice at the moment, only cell sizes of about $9F^2$ per memory cell are attainable using the known concepts for memory cells that contain one selection transistor and a storage capacitor (such as a DRAM). The goal, beginning with the 1-gigabit generation, is a cell size of $8F^2$, where F=0.18 $\mu$m.

SUMMARY OF THE INVENTION

It is accordingly an object of the invention to provide a memory cell configuration and production process therefor which overcome the above-mentioned disadvantages of the prior art devices and methods of this general type, which has a tightly packed memory cell configuration that has preferably ferroelectric memory cells and that can be produced easily and reliably, and a corresponding production process.

With the foregoing and other objects in view there is provided, in accordance with the invention, a memory cell configuration with a plurality of one of ferroelectric memory cells and dynamic memory cells, including:

a semiconductor substrate having a main face;

alternating trenches having trench bottoms and lands having land ridges extending parallel in a longitudinal direction of the main face and formed in the semiconductor substrate;

a channel stop layer buried in the lands for dividing the semiconductor substrate into a lower region that includes the trench bottoms and an upper region that includes the land ridges;

trench channel stop regions disposed in the trench bottoms in the lower region of the semiconductor substrate;

first planar selection transistors disposed in the trenches and separated from each other by the trench channel stop regions disposed between adjacent pairs of the first planar selection transistors;

land channel stop regions disposed along the land ridges in the upper region of the semiconductor substrate;

second planar selection transistors disposed along the lands and separated from each other by the land channel stop regions disposed between adjacent pairs of the second planar selection transistors, the first planar selection transistors and the second planar selection transistors have respective source regions, gate regions, channel regions and drain regions being offset longitudinally from one another such that the source regions and the drain regions of the first planar selection transistors and the second planar selection transistors alternate in a transverse direction in the main face of the semiconductor substrate;

isolated word lines extending in the transverse direction along the main face of the semiconductor substrate for triggering the gate regions of the first planar selection transistors and the second planar selection transistors;

isolated bit lines extending in an oblique direction along the main face of the semiconductor substrate and connected to the source regions of the first planar selection transistors and the second planar selection transistors;

capacitor contacts; and a plurality of capacitors, one of the plurality of capacitors connected to each of the drain regions of an associated one of the first planar selection transistors and the second planar selection transistors via the capacitor contacts.

The memory cell configuration of the invention with preferably ferroelectric memory cells has the advantage over the known memory cell configurations that it has an attainable minimum cell size of less than $6F^2$ with planar transistors that are disposed both on trench bottoms and on land ridges. The memory cell configuration is simple to produce and does not require STI-isolation trenches as previous concepts do.

In contrast to the usual process for producing a DRAM with a stacked capacitor, the bit line in the memory cell configuration of the invention no longer extends perpendicular to the word line, but rather at an angle of typically 60° to it. For connecting the bit lines for the transistors, the bit lines are raised to the original semiconductor substrate height with correspondingly short contact jacks (of land ridges) and long contact jacks (of trench bottoms). The contact jacks can be embodied in a self-aligned fashion. With these exceptions, the usual process steps can be employed exclusively.

The idea on which the present invention is based is that the selection transistors are realized as planar transistors offset from one another on both the trench bottoms and the land ridges, and both types of selection transistor can be reached via one bit line, and one or the other type can be reached in alternation via the word lines. The minimum planar area of the memory cell with a dielectric or ferroelectric capacitor is about $4F^2$. In the production process disclosed here, the size of approximately $5F^2$, in the case where the trenches have a width of 1.5F to compensate for the isolation spacer and the lands have a lesser width of F, is readily feasible.

In a preferred refinement, isolating spacers, preferably of nitride or oxide, are provided along the trench walls. This assures good mutual isolation of the first and second selection transistors.

In a further preferred refinement, the trenches are wider, by the thickness of the spacers, than the lands. This compensates for the loss of area caused by the spacers.

In a further preferred refinement, the isolating spacers, preferably of nitride or oxide, are provided along the word lines and/or bit lines.

In a further preferred refinement, the trenches are filled with an isolator layer through which the various contact jacks for connecting the first selection transistors to the bit lines extend.

In a further preferred refinement, the lands are covered by an isolator layer, through which the various contact jacks for connecting the second selection transistors to the word lines or bit lines extend.

In a further preferred refinement, on the word lines and bit lines a further isolator layer is provided, and various stacked capacitors are provided, which are connected to the drain region of the applicable selection transistor via the respective capacitor contact.

In a further preferred refinement, a layer with a dielectric with the highest possible dielectric constant, preferably of a ferroelectric, such as strontium bismuth tantalate, is provided.

In a further preferred refinement, over the layer formed of a ferroelectric, a common upper capacitor electrode is provided.

In a further preferred refinement, the trenches, lands, word lines, and bit lines each have a minimum feature width F, and each memory cell occupies a region whose area is $4F^2$.

Other features which are considered as characteristic for the invention are set forth in the appended claims.

Although the invention is illustrated and described herein as embodied in a memory cell configuration and production process therefor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a cross-sectional view of the cell array of the memory cell configuration in a second process stage;

FIG. 4 is a plan view of the cell array of the memory cell configuration in the second process stage shown in FIG. 3;

FIG. 5 is a plan view of the cell array of the memory cell configuration in a third process stage.

DESCRIPTION OF THE PREFERRED EMBODIMENTS

Figure 1:
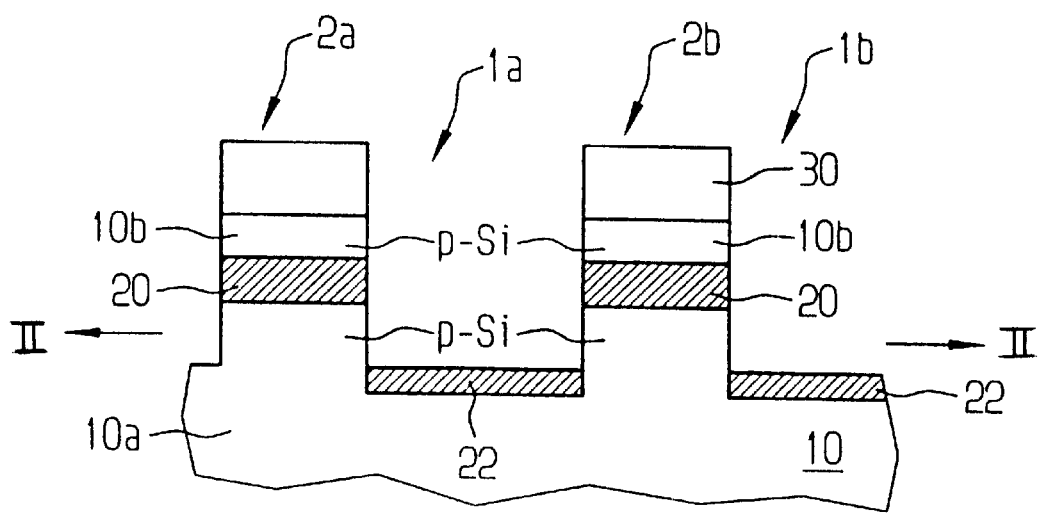
FIG. 1 is a diagrammatic, cross-sectional view of a cell array in one embodiment of a memory cell configuration in a first process stage according to the invention.

In all the figures of the drawing, sub-features and integral parts that correspond to one another bear the same reference symbol in each case. Referring now to the figures of the drawing in detail and first, particularly, to FIG. 1 thereof, there is shown a cross-sectional view of a cell array in one embodiment of a memory cell configuration of the invention, in a first process stage, and FIG. 2 is a plan view corresponding to it.

Figure 2:
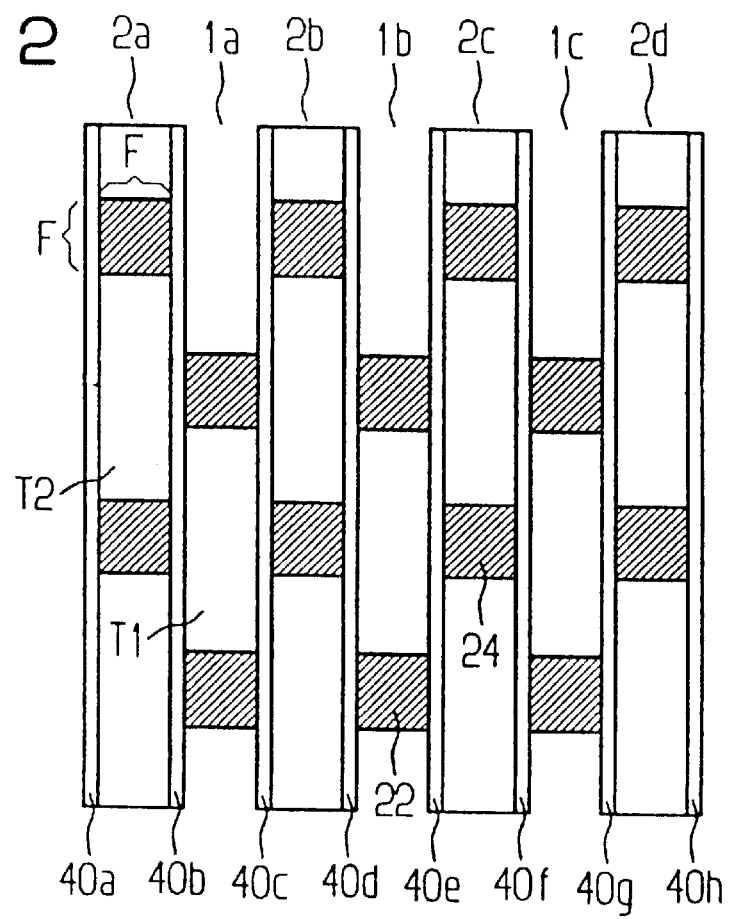
FIG. 2 is a plan view of the cell array of the memory cell configuration of the invention in the first process stage shown in FIG. 1.

As shown in FIGS. 1 and 2, a semiconductor substrate 10 with a well or a epitaxial layer of the p-type, for instance, is first furnished.

First, a full-area implantation for forming a channel stop layer 20 is performed with a maximum concentration disposed approximately at half a depth of a trench 1*a*–1*c* yet to be formed.

Next, in a photo process, a nitride hard mask 30 is structured and a periodic configuration of alternating parallel trenches 1*a*–1*c* and lands 2*a*–2*d* extending longitudinally of a main face of the semiconductor substrate 10 is thereby etched.

The channel stop layer 20 divides the semiconductor substrate into a lower region 10a including trench bottoms and an upper region 10b including land ridges, in which first and second selection transistors, respectively, are later formed.

After a further photo step using photoresist strips that extend perpendicular to the trenches 1a–1c, shallow trench channel stop regions 22 for isolating later adjacent transistors are implanted in the trenches.

Next, TEOS oxide is deposited and ground back by chemical-mechanical polishing, using the nitride hard mask 30 as a stop. After an ensuing wet nitride etching operation and a corresponding further photo step for the lands, shallow land channel stop regions 24 (FIG. 2) for isolating later adjacent transistors can be implanted in the lands. After that, the TEOS oxide is etched out, and nitride spacers 40a–40h are formed along the trench walls, which leads to the process stage shown in FIG. 2.

As indicated by the symbols T1 and T2 in FIG. 2, regions for the first transistors T1, which are separated by the trench channel stop regions 22, are located in the trenches 1a–1c, and the regions for the second transistors T2, which are separated by the land channel stop regions 24, are located on the lands 2a–2d.

FIG. 3 is a cross-sectional view of the cell array of the memory cell configuration of the invention, in a second process stage, and FIG. 4 is a plan view accordingly.

As shown in FIGS. 3 and 4, the next process steps performed are an implantation into the channel regions in order to adjust a threshold voltage, and after that a growing of a gate oxide 50. For a gate connection by word lines 61–64, polysilicon 62b, silicide 62a and nitride are deposited and structured, and a nitride layer for forming a non-illustrated nitride spacer is deposited and structured, all in accordance with conventional process technology.

After that self-aligning source/drain implantations are made for simultaneously forming source and drain regions 551, 552 and 581, 582 of the first and second selection transistors T1, T2. As indicated by the transistors T1 and T2, the transistors T1, T2 are longitudinally offset from one another in such a way that in a transverse direction in the main face of the semiconductor substrate 10, source and drain regions 582, 551 of the first and second selection transistors T1, T2 alternate. In a region that is covered by the word lines 61–64, gate/channel regions and the trench and the land channel stop regions 22 and 24, respectively, also alternate accordingly.

If the trenches 1a–1c, the lands 2a–2d, the word lines 61–64 and bit lines 91–94 each have the process-dictated minimum feature width F, then each transistor T1, T2 occupies an area of $3F^2$, and the channel stop region of ½ $F^2$ is added on each side, so that one memory cell has an area of $4F^2$ available.

As an isolator layer, an intermediate oxide 101 can now be deposited in and grown on the trenches 1a–1c and lands 2a–2d, respectively, and planarized.

FIG. 5 is a plan view of the cell array of the memory cell configuration of the invention, in a third process stage.

As shown in FIG. 5, in a further photo step bit line contact holes 80 are etched into the intermediate oxide 101, to create a bit line connection to the source regions of the respective selection transistors T1, T2.

Deep contact holes should be made in the trenches 1a–1c, and shallow contact holes should be made on the lands 2a–2d. This can be done at the same time, if the etching process is selective enough; otherwise, two photo steps must be performed. The contact holes are expediently lined with a thin nitride spacer.

Figure 6:
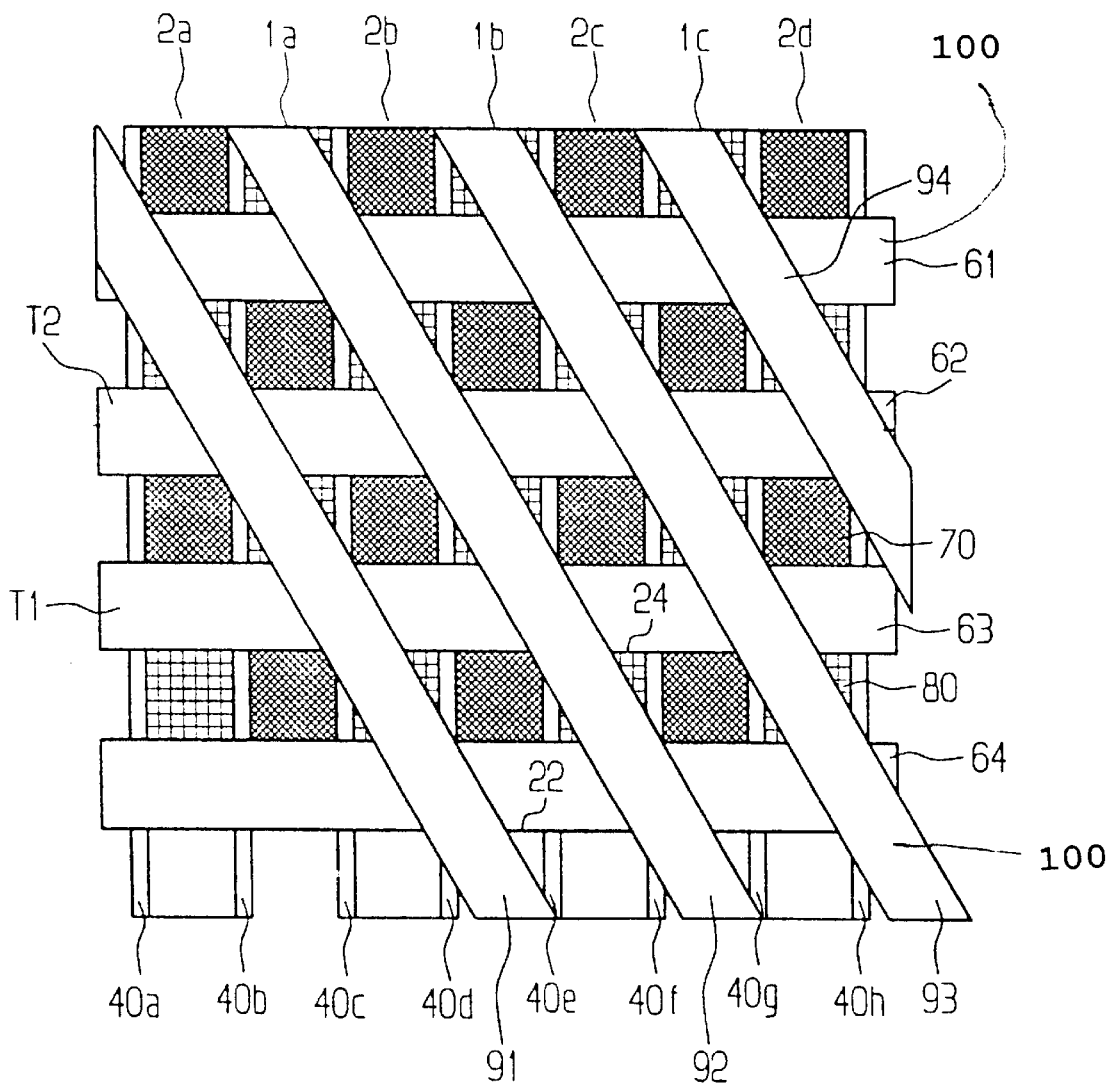
FIG. 6 is a plan view of the cell array of the memory cell configuration in a fourth process stage.

FIG. 6 is a plan view of the cell array of the memory cell configuration of the invention, in a fourth process stage.

Analogously to the word lines 61–64, the bit lines 91–94 are formed by conventional process technology; thus polysilicon 62b, silicide 62a or tungsten and nitride are deposited and structured, and a nitride layer for forming a non-illustrated nitride spacer is deposited and structured.

In particular, the isolated bit lines 91–94 extend obliquely along the main face of the semiconductor substrate 10 for connection of the first and second selection transistors T1, T2 In the respective source regions. This is followed by a further intermediate-oxide deposition and planarization.

As suggested in FIG. 6 by reference numeral 70, in a further photo step, capacitor contact holes are etched in self-aligned fashion into the further intermediate oxide, so as to create a respective capacitor connection to the drain regions of the selection transistors T1, T2. Once again, deep contact holes should be made in the trenches 1a–1c, and shallow contact holes on the lands 2a–2d, analogously to the above-described bit line contacts.

Finally, on the word lines 61–64 and the bit lines 91–94, a further isolator layer 100 is provided, on which respective stacked capacitors are provided, which are connected to the drain region of the applicable selection transistor T1, T2 via the respective capacitor contact 70. In the preferred case, a layer containing a ferroelectric, for instance of strontium bismuth tantalate, is provided in the stacked capacitors.

Although the present invention has been described above in terms of preferred exemplary embodiments, it is not limited to them and instead can be modified in manifold ways.

In particular, the fundamental materials and additive materials indicated are merely examples and can be replaced by other suitable materials.

The following other ferroelectric materials can be used, among others: lead zirconium titanate, barium titanate, lead lanthanum titanate, strontium bismuth tantalate, and bismuth titanate.

Nor is the capacitor dielectric limited to ferroelectrics; it can instead be replaced with other suitable dielectrics, such as the paraelectric material barium strontium titanate, strontium titanate, and barium zirconium titanate.

It is also possible to use a very thin (electrical equivalent thickness: 3 nm) oxide-nitride layer (ON) or tantalum pentoxide layer ($Ta_2O_5$) or titanium dioxide layer ($TiO_2$), which is applied over a polysilicon electrode that has been roughened to increase its surface area (known as a rugged plug or hemispherical grain poly HSG).

We claim:

1. A process for producing a memory cell configuration, which comprises:

furnishing a semiconductor substrate having a main face;

forming a periodic configuration of alternating trenches having trench bottoms and lands having land ridges extending parallel in a longitudinal direction of the main face of the semiconductor substrate;

providing a channel stop layer for dividing the semiconductor substrate into a lower region that includes the trench bottoms and an upper region that includes the land ridges;

forming trench channel stop regions in the trenches and land channel stop regions on the lands for defining and separating first and second selection transistors;

forming the first and second selection transistors having respective source regions, gate regions, channel regions and drain regions which are offset longitudinally from one another such that the source regions and the drain regions of the first and second selection transistors alternate in a transverse direction in the main face of the semiconductor substrate;

forming isolated word lines, extending in the transverse direction along the main face of the semiconductor substrate, for triggering the gate regions of the first and second selection transistors;

forming isolated bit lines, extending in an oblique direction along the main face of the semiconductor substrate, and connecting to the source regions of the first and second selection transistors;

forming a capacitor contact; and forming capacitors with one capacitor connected to each of the drain regions of the first and second selection transistors via the capacitor contact.

2. The process according to claim 1, which comprises performing self-aligning source/drain implantations for simultaneously forming the source regions and the drain regions of the first and second selection transistors.

3. The process according to claim 1, which comprises forming the land channel stop regions on the lands by:
   filling the trenches by deposition and planarization of TEOS oxide;
   forming selectively the land channel stop regions in the lands; and
   removing the TEOS oxide.

4. The process according to claim 1, which comprises forming isolating spacers along trench walls.

5. The process according to claim 1, which comprises forming the capacitors as ferroelectric capacitors.

6. The process according to claim 1, which comprises forming the memory cell configuration with ferroelectric memory cells.

* * * * *